(12) United States Patent
Philipp (10) Patent No.: US 6,452,514 B1
(45) Date of Patent: Sep. 17, 2002

(54) CAPACITIVE SENSOR AND ARRAY

(76) Inventor: Harald Philipp, 7 Cirrus Gardens, Hamble Hampshire SD31 4RH (GB)

(*) Notice: Subject to any disclaimer, the term of this patent is extended or adjusted under 35 U.S.C. 154(b) by 0 days.

(21) Appl. No.: 09/491,129

(22) Filed: Jan. 26, 2000

Related U.S. Application Data (60) Provisional application No. 60/117,326, filed on Jan. 26, 1999.

(51) Int. Cl.[7] ............................................. H03K 17/94
(52) U.S. Cl. ........................ 341/33; 341/22; 178/18.06
(58) Field of Search .................. 341/33, 22; 178/18.06, 178/18.07; 200/343; 345/168

(56) References Cited

U.S. PATENT DOCUMENTS

| | | |
|---|---|---|
| 4,550,221 A | 10/1985 | Mabusth |
| 4,651,133 A | 3/1987 | Ganesan et al. |
| 4,879,461 A | 11/1989 | Philipp |
| 5,543,591 A | 8/1996 | Gillespie et al. |
| 5,572,205 A | 11/1996 | Caldwell et al. |
| 5,730,165 A | 3/1998 | Philipp |
| 5,841,078 A | 11/1998 | Miller et al. |
| 5,861,583 A | 1/1999 | Schediwy et al. |
| 5,914,465 A * | 6/1999 | Allen et al. .................... 341/33 |
| 5,973,623 A * | 10/1999 | Gupta et al. .................... 341/33 |
| 6,256,022 B1 * | 7/2001 | Manaresi et al. ........ 178/18.06 |
| 6,288,707 B1 * | 9/2001 | Philipp ........................ 341/22 |

\* cited by examiner

*Primary Examiner*—Timothy Edwards, Jr.
(74) *Attorney, Agent, or Firm*—David Kiewit (57) ABSTRACT

Proximity of a body, which may be a user's finger, to an electrode pair is sensed by a charge transfer capacitive measurement approach. The electrode pair thus acts as a key that can be arrayed with other electrode pairs to form a keypad, keyboard, linear slider control, or liquid level sensor. In one embodiment of the invention each key is associated with an alternating voltage source and a pair of electrodes mounted on or within a solid dielectric substrate or panel so as to be separated from each other by a gap. The voltage source is connected to a driven electrode, a sampling charge detector is connected to a second, receiving, electrode, and the output of the charge detector is, in turn, fed into a signal processor. Disturbances in coupling between the two electrodes are detected through the solid substrate or panel material when a substance or object approaches or contacts the panel. The receiving electrode is a low-impedance node during the sampling phase of the process, which aids in keeping the sensor from being affected by wiring length or by extraneous objects near an output lead..

10 Claims, 7 Drawing Sheets

CAPACITIVE SENSOR AND ARRAY

CROSS REFERENCE TO RELATED APPLICATIONS

This application claims the priority date of a U.S. Provisional Application for Patent having Ser. No. 60/117,326, which was filed on Jan. 26, 1999

BACKGROUND OF THE INVENTION

1. Field of the Invention

The invention pertains to the sensing of matter in contact or in close proximity to a surface. One specific area of interest is in human interfaces, such as switches, keys, and keyboards, used for entry of data or for control of an apparatus or process. Another specific area of interest is the sensing of inanimate matter such as powders and fluids, as is done in the sensing of the level or volume of a fluent material in a container.

2. Background Information

The invention employs capacitance sensing, and in particular a form of sensing known as 'charge-transfer' (or 'QT') sensing which has been taught by the inventor in his U.S. Pat. No. 5,730,165, the disclosure of which is herein incorporated by reference. Charge transfer sensing uses electronic switch closures to induce a charge onto an electrode. A disturbance in the resulting electric field is sensed by measuring the amount of charge on the electrode and to thereby determine the change in capacitance at the electrode.

Caldwell et al., in U.S. Pat. No. 5,572,205, teach a capacitive touch control system that is responsive to a user input selection and that can be configured as a touch pad disposed on an electrically non-conducting substrate, such as glass ceramic electrical cook-top. A source signal having a primary frequency that is greater than 150 kHz, and preferably in the range of between 150 kHz and 500 kHz, is applied to one portion of their touch pad. The touch pad couples the electrical signal to another portion of the touch pad in order to develop a detection signal, which is decoded in order to determine the presence of the capacitance of a user. The decoder preferably includes a peak detector composed of a low gain circuit in order to avoid distortion of the detection signal.

BRIEF SUMMARY OF THE INVENTION

In the present invention two or more electrodes are arranged to create an electric field transmitted through an adjacent dielectric which can be disturbed by the proximity of an object A charge transfer measurement circuit is connected to one of the electrodes.

Because one of the major anticipated applications of the invention is in keyboards used in data entry, the sensing elements are sometimes hereinafter referred to as 'keys'. It will be understood that this is done to simplify the presentation and to avoid reciting lists of known sensing or switching products that could employ the invention, and that 'key', when so used, represents a proximity detection zone for any possible application.

Thus, one aspect of the invention is the provision of apparatus and method for detecting proximity to an electrode pair to form a key. Another aspect of the invention is the provision of apparatus and method for detecting proximity to one or more of a matrix of electrodes so as to form a keypad, keyboard, slider switch analog, or level sensor.

The creation of a key matrix follows from the arrangement of a plurality of electrode pairs, where one of each pair is connected to a voltage drive source and the second of each pair is connected to a charge detector. In the general case for a matrix there are X drive lines and Y charge detectors. Although a minimal matrix could comprise two drive lines and a single charge detector, or vice versa, an N by M matrix is expected to usually involve at least four keys; e.g., an X=2, Y=2 arrangement. It may be noted that arrangements having the same number of drive lines as they do charge detectors (hereinafter referred to as "square matrices") are generally preferred because these yield the greatest number of keys for a given amount of circuitry and wiring. It may be noted that the terms 'matrix' and 'square' have nothing to do with the physical form of the key matrix. The keys can be arrayed linearly, circularly, or randomly on a single surface, or in any fashion desired on a plurality of surfaces. Moreover, the keys do not have to be the same physical size or shape; some can be large and circular, other small and triangular, others medium and rectangular.

In one embodiment of the invention, each key is associated with an alternating voltage source and a pair of electrodes mounted on or within a solid dielectric substrate or panel so as to be separated from each other by a gap. The voltage source is connected to a first electrode, a sampling charge detector is connected to the second electrode, and the output of the charge detector is, in turn, fed into a signal processing means. Disturbances in coupling between the two electrodes are detected through the solid substrate or panel material when a substance or object approaches or contacts the panel.

In another embodiment of the invention, each key is associated with an alternating voltage source and a pair of electrodes so as to be separated from each other by a gap. The voltage source is connected to a first electrode, a sampling charge detector is connected to the second electrode, and the output of the charge detector is, in turn, fed into a signal processing means. Disturbances in coupling between the two electrodes are detected when a substance or object approaches or contacts the electrode set directly, without an intervening solid dielectric layer.

In operation of a preferred embodiment of the invention an alternating voltage source is connected to a first (X) electrode that projects a time-varying e-field across a gap. This field is, at least in part, received by a second, receiving (Y), electrode. The receiving electrode is connected to a sampling charge detector which acts to sample the change in the charge coupled across the gap caused by the dV/dt of the pulsed voltage. It is a feature of the invention that the receiving electrode is a low-impedance node during the sampling phase of the process. This ensures that the charge coupled to the second electrode does not cause an appreciable voltage rise on the second electrode.

Although it is believed that the foregoing recital of features and advantages may be of use to one who is skilled in the art and who wishes to learn how to practice the invention, it will be recognized that the foregoing recital is not intended to list all of the features and advantages. Moreover, it may be noted that various embodiments of the invention may provide various combinations of the hereinbefore recited features and advantages of the invention, and that less than all of the recited features and advantages may be provided by some embodiments.

BRIEF DESCRIPTION OF THE SEVERAL VIEWS OF THE DRAWING

FIG. 2b is an electrical schematic corresponding to FIG. 2a.

FIG. 3b is an electrical schematic corresponding to FIG. 3a

FIG. 4b is a schematic depiction of timing relationships used in the operation of the circuit of FIG. 4a.

FIG. 5b is an electrical timing diagram for the circuit of FIG. 5a.

FIG. 6 is an electrical schematic of an X–Y multiplexed array of charge measurement circuits of the type depicted in FIG. 4a.

FIG. 7 is an electrical schematic of an X–Y multiplexed array of charge measurement circuits of the type depicted in FIG. 5a.

FIG. 8b is a schematic depiction of timing relationships in the operation of the circuit of FIG. 8a.

DETAILED DESCRIPTION OF THE INVENTION

Figure 1A:
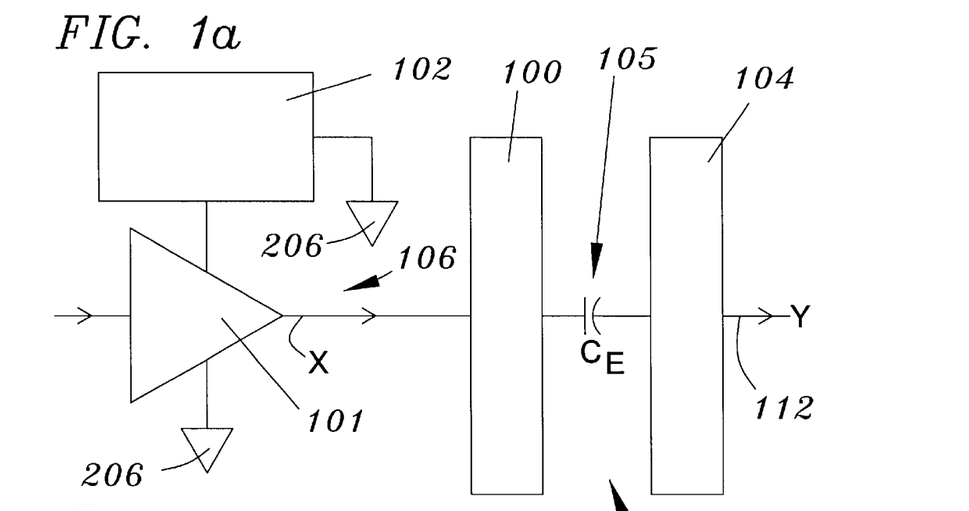
FIG. 1a is an electrical schematic of one embodiment of the invention having an alternating signal source and an electrode pair.
Figures 1B, 1C:
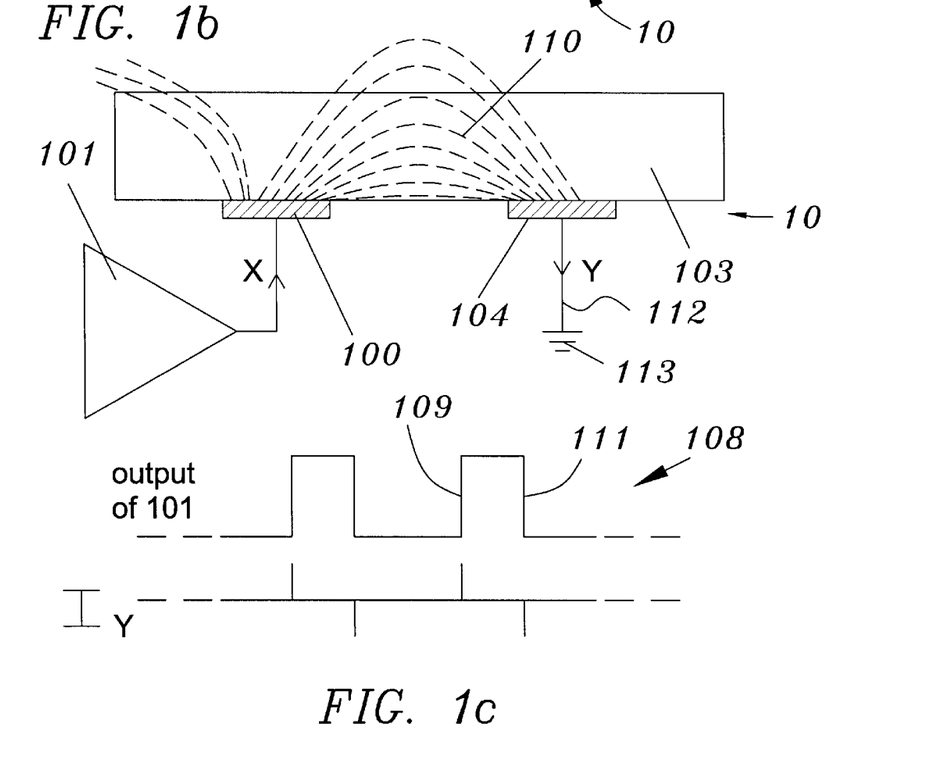
FIG. 1b is a partial schematic depiction showing a section of a solid, fixed dielectric substrate having two electrodes disposed thereon, or alternatively, two fixed electrodes adjacent to a moving dielectric material, solid or fluid, which is to be sensed.
FIG. 1c is a schematic depiction of the waveform output by the alternating signal generator of FIGS. 1a and 1b, wherein the signal generator is a pulse source.
Figure 1D:
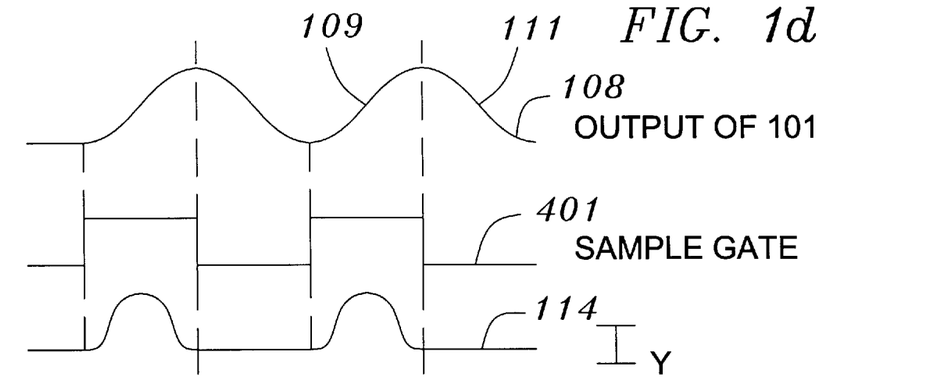
FIG. 1d is a schematic depiction of the waveform output by the alternating signal generator of FIGS. 1a and 1b, wherein the signal generator is a sinusoidal source.

A schematic view of the simplest form of the invention is shown in FIGS. 1a, 1b, 1c and 1d. A key, or composite sensing element 10 comprises a first, drive, electrode 100 driven by a signal generator 101, which in one embodiment can be a simple CMOS logic gate powered from a conventionally regulated supply 102 to provide a periodic plurality of voltage pulses having some selected duration. Alternatively, the voltage source 101 can be a sinusoidal generator or generator of a cyclical voltage having another suitable waveform. In one embodiment, a dielectric material or substrate 103 supports the drive electrode 100 as well as a second, receiving, electrode 104 connected to a receiving circuit having a low impedance or 'virtual ground' characteristic as depicted in cursory, not literal, fashion by 113. A changing electric field 110 is generated in the dielectric 103 on the rising 109 and failing 111 edges of the train of voltage cycles 108 applied to the driven electrode 100 FIG. 1c shows these as pulses, while 1d depicts sinusoidal waveforms; other waveforms such as triangle waves, slew-rate-limited pulses, etc. can be used instead, for example, to suppress radiated RFI. The nature of the waveform used is not crucial to the discussion of the operation of the invention. Throughout the remainder of the discussion pulses are depicted for convenience, but these may just as easily be other waveforms for the above and other reasons, and thus the use of pulses or square waves should not be construed as a limitation with regard to any X-drive voltage source depicted in any figure or discussed in conjunction therewith.

The receiving electrode 104 receives or sinks the e-field 110 via a coupling capacitance 105 that is generally indicated in the drawing with the symbol $C_E$, which results in current signal 114 due to the capacitive differentiation of 108 by means of capacitance 105. An output lead 112 from the receiving electrode 104 conducts this current signal to a charge measurement circuit described in conjunction with further figures. This differentiation occurs because of the equation governing current flow through a capacitor:

$$i_E = C_E * dV/dt.$$

where $C_E$ is the inter-electrode capacitance and V is the drive voltage. The amount of charge coupled across each key during an edge transition is defined as the integral of the above equation over time, or:

$$Q_E = C_E * V$$

The charge coupled on these transitions, $Q_E$, is independent of the rise time of V, which is an important result. Moreover, $Q_E$ is proportional to the voltage swing on the drive electrode 100 and the magnitude of the coupling capacitance 105 between the driven 100 and receiving 104 electrodes. As is known in the art, the degree of coupling is dependent on the proximity, size, geometry, and relative attitude of the two electrodes, the material composition of the substrate dielectric, and the proximity of the composite sense element to other objects, such as fluids and human fingers. Inasmuch as solid dielectrics, such as plastic and glass, have a much higher dielectric constant than air, if the substrate is thick enough the coupling between the two electrodes 100 and 104 will principally be through the substrate.

Figure 2A:
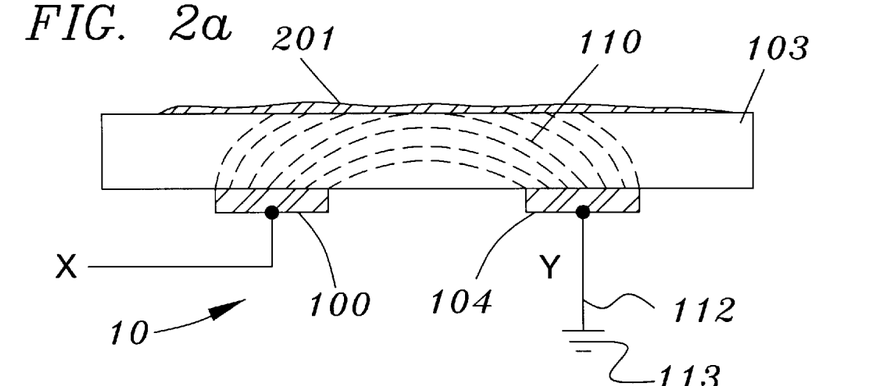
FIG. 2a is a partly schematic depiction similar to that of FIB. 1b, wherein a thin conductive film, such as water, is shown on the dielectric substrate.
Figure 2B:
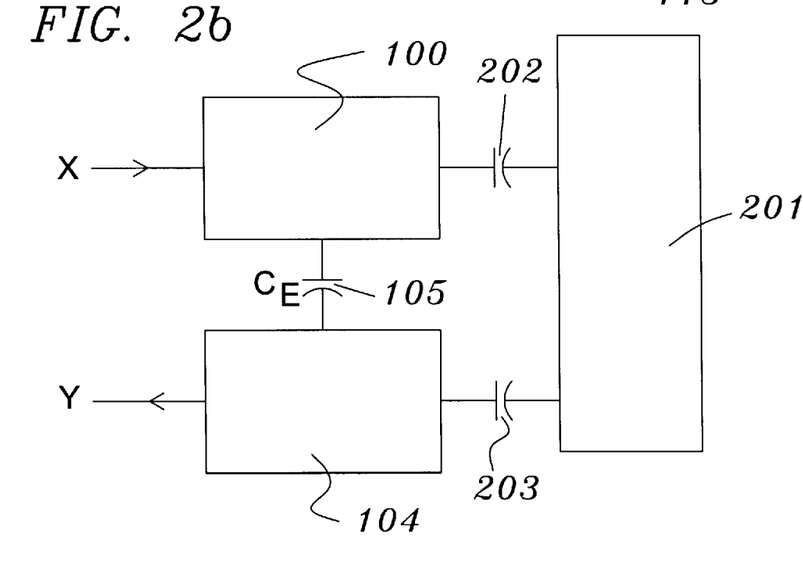

If an external contact is made with the composite sense element by a conductive film 201, such as by a metal, or by an ionic aqueous fluid as shown in FIG. 2a, the coupling between the two electrodes will increase because the external film will have coupled to it the signal from the emitting electrode 100. The film will then act as a secondary radiator of the same signal, and in turn will strongly couple the same signal into the receiving electrode 104. FIG. 2b shows schematically what occurs when such a film is present. Two additional capacitors 202 and 203 are formed. One of these 202 is from the drive electrode to the film, the other 203 is from the film to the receive electrode. These act in unison to increase the amount of capacitive signal coupling from the driven to the receiving electrode. These effects are prevalent in many situations where keypads or contact sensors are to be used. For example, both outdoor controls exposed to condensing humidity and rain, and appliance keypads in kitchens must commonly contend with extraneous films. In such instances the film should be ignored if at all possible in order to prevent false detection.

In practice, electrodes 100 and 104 are typically interdigitated, which is known in the art to facilitate a higher amount of coupling of e-field from and to the respective electrodes via the dielectric layer. Interdigitation increases the effective 'gain' of the key and reduces the need for higher gain amplification or higher levels of drive signal. Interdigitation also tends to localize the fields in a more defined area and permits the key shape to cover a larger surface than otherwise possible with simple neighboring electrodes as depicted in FIG. 1a through FIG. 2b.

Figure 3A:
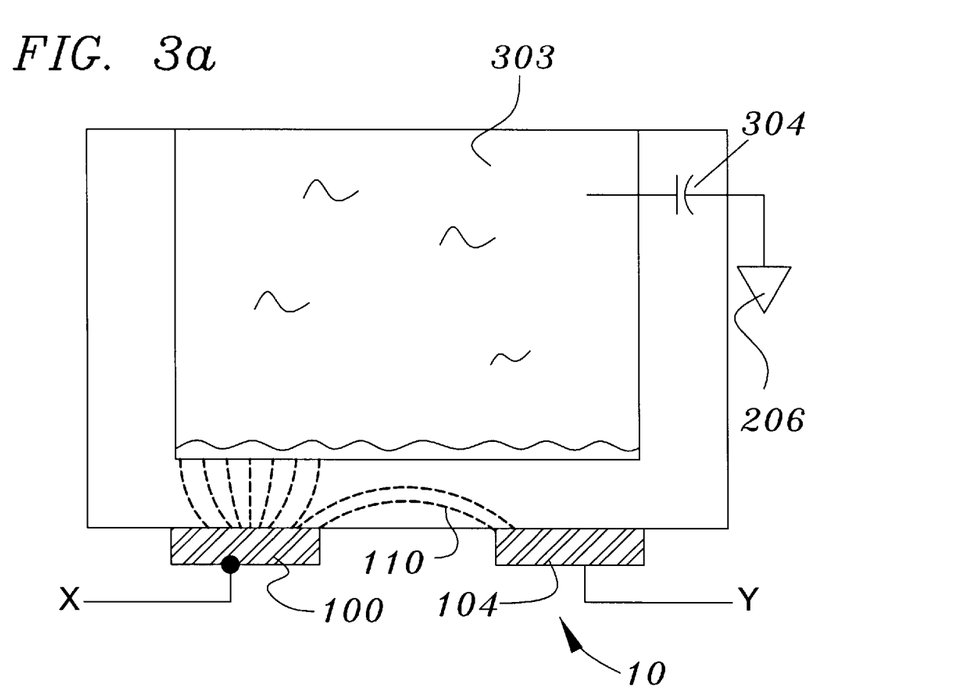
FIG. 3a is a partial schematic depiction, similar to those of FIGS. 1b and 2a, wherein a massive conducting body, such as a container of water, is shown adjacent the electrodes.
Figure 3B:
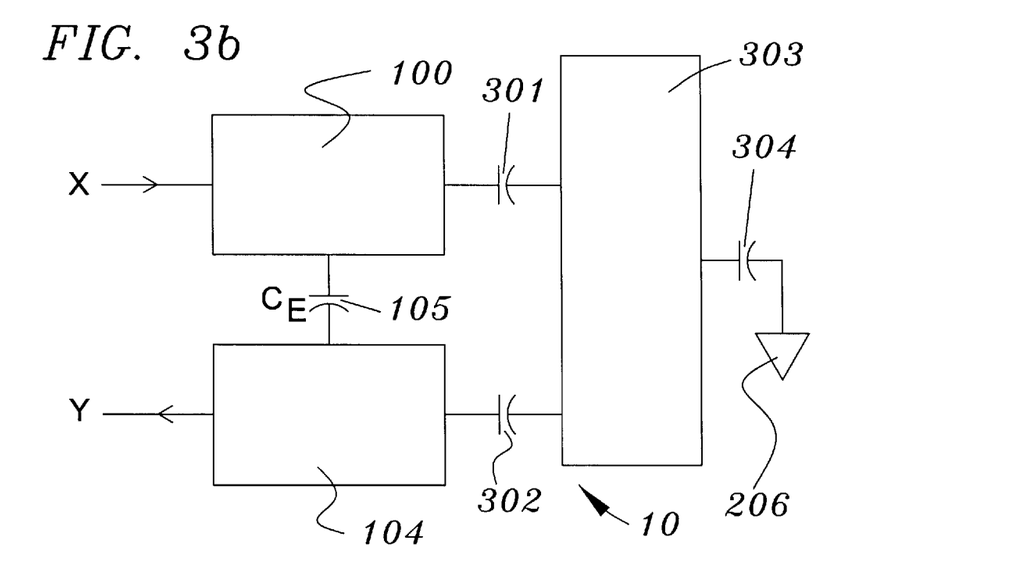

If, on the other hand, external contact is made with the composite sense element 10 by a large body, such as a human, or perhaps by a large volume of fluid as shown in FIG. 3a, the coupling of charge between 100 and 104 will be reduced because the large object has a substantial capacitance to earth 206 (or to other nearby structures whose path will complete to the ground reference potential of the circuitry controlling the sense elements). This reduced coupling occurs because the coupled e-field between the driven 100 and receiving 104 electrodes is in part diverted away from the receiving plate 104 to earth. This is shown schematically in FIG. 3b. Capacitances 301 and 302 are set up, which in conjunction with capacitance 304 from the third object to free space or a local ground, and which act to shunt the e-field away from the direct coupling 105 present between 100 and 104. The coupling capacitance 105 in FIG. 3b is significantly less than is the corresponding coupling capacitance 105 of FIG 1a as a result of the diversion of field lines to the object 303. If the receive electrode 104 is connected to a 'virtual ground', then the effect of the added capacitance 302 will not be significant. If the receiving electrode 104 is connected to a high impedance amplifier, then the effect of 302 can be significant, because it will act to reduce the signal on 104 even further.

The difference in signal shift polarity between the above two scenarios of FIGS. 2a and 3a is significant and can be taken advantage of to create a robust sense element which can detect and discriminate between surface films and bulk materials or human fingers. In one case (e.g., FIG. 2a) the detected material causes a rise in signal, while in the case of FIG. 3a, the detected material causes a decrease in signal.

It is preferred in most embodiments to use a solid panel material 103 as an intervening layer between the electrodes and the material or object to be sensed. This is not only for purposes of concealment of the electrodes 100 and 104 and associated wiring, but also to allow the fields to 'mix' within the panel prior to exiting into free space. An overlying dielectric panel provides an efficient means of creating coupling capacitances 105, 301 and 302, the latter two being set up when sensing an object, finger, or other substance.

In another embodiment, 103 of FIG. 1b is actually the substance to be sensed, such as a dielectric fluid (e.g. oil, petrol), or a moving solid (e.g. a plastic encoder vane) that is directly contacting or very close to the electrodes. The presence of this fluid or solid adjacent to 100 and 104 creates additional coupling 110 between the electrodes and increases signal strength, resulting in a higher level of $C_E$105, which can be readily detected. In this case the electrodes are mechanically affixed in space or bonded to a non-critical dielectric substrate for mechanical stability (not shown in the context of FIG. 1b).

Figure 4A:
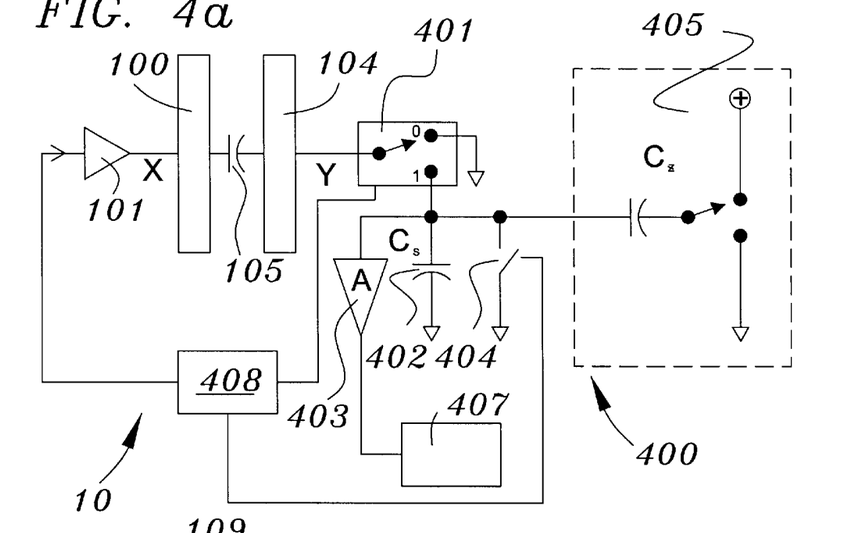
FIG. 4a is an electrical schematic of one embodiment of a charge transfer measurement circuit.
Figure 4B:
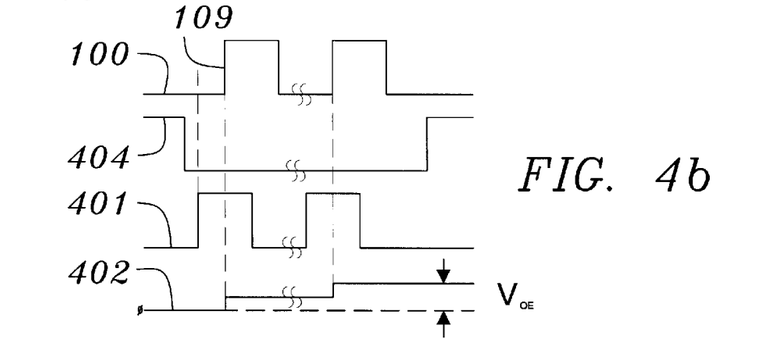

Turning now to FIG. 4a, one finds a circuit based in part on the charge-transfer ("QT") apparatus and methods disclosed in the inventor's U.S. Pat. No. 5,730,165. This circuit shows an implementation of a sensor comprising electrodes 100,104, and processing circuitry 400. The exemplar processing circuitry 400 depicted in FIG. 4a comprises a sampling switch 401, a charge integrator 402 (shown here as a simple capacitor), an amplifier 403 and a reset switch 404, and may also comprise optional charge cancellation means 405. The timing relationships between the electrode drive signal from the voltage source 101 and the sample timing of switch 401, as shown in FIG. 4b, are provided by a suitable synchronizing means, which may be a microprocessor or other digital controller 408. In the implementation shown, the reset switch 404 is initially closed in order to reset the charge integrator 402 to a known initial state (e.g., zero volts). The reset switch 404 is then opened, and at some time thereafter the sampling switch 401 is connected to charge integrator 402 via terminal 1 for an interval during which the voltage source 101 emits a positive transition, and thereafter reconnects to terminal 0, which is an electrical ground or other suitable reference potential. The voltage source 101 then returns to ground, and the process repeats again. At the end of a repetition of 'n' of these cycles, (where n is a finite non-zero integer) the sampling switch 401 is held at position 0 while the voltage on the charge integrator 402 is measured by a measurement means 407, which may comprise an amplifier, ADC or other circuitry as may be appropriate to the application at hand. After the measurement is taken, the reset switch 404 is closed again, and the cycle is restarted when next desired. The process is referred to herein as being a measurement 'burst' of length 'n'. where 'n' can range from 1 to any finite number. The circuit's sensitivity is directly related to 'n' and inversely to the value of the charge integrator 402.

It should be understood that the circuit element designated as 402 provides a charge integration function that may also be accomplished by other means, and that the invention is not limited to the use of a ground-referenced capacitor as shown by 402. It should be self-evident to the practitioner that the charge integrator 402 can be an opamp-based integrator to integrate the charge flowing through the Y lines. Such integrators also use capacitors to store the charge. It may be noted that although integrators add circuit complexity they provide a more ideal summing-junction load for Y sense currents and more dynamic range. If a slow speed integrator is employed, it may be necessary to use a separate capacitor in the position of 402 to temporarily store the charge at high speed until the integrator can absorb it in due time, but the value of such a capacitor becomes relatively non-critical compared to the value of the integration capacitor incorporated into the opamp-based integrator.

The circuit shown in FIG. 4a provides an important electrical feature, that of a 'virtual ground' node on the Y line, which is sampled during the closure of 401 to position 1. The charge integrator, whether a simple ground-referenced capacitor or an opamp-based integrator, provides a summing-junction attribute which, as discussed above , is invaluable for keeping the effects of interference and stray capacitance of the Y connections low.

Switch 401 should preferably connect Y lines 112 to ground when not actually sampling charge to create an artificial ground plane on the matrix, thus reducing RF emissions, and also permitting the coupled charge of opposite polarity to that being sensed by the charge integrator 402 to properly dissipate and neutralize. If one were to omit grounding the Y lines between sample pulses the system would be purely AC coupled and would quickly cease to function, because charge would be both pulled and pushed across 105 with no DC restoration. It is also possible to use a resistor to ground on the Y lines to accomplish the same effect between transitions of voltage sources 101. As an alternative to a single SPDT switch 401, two independent switches can be used if timed in an appropriate manner. Although there are many alternative approaches possible, it should be clear that an important feature of a preferred embodiment of the invention is the provision of means for restoring charge on the receiving plate 104 after each sampling.

As explained in the inventor's U.S. Pat. No. 5,730,165, there are many signal processing options possible for the manipulation and determination of a detection or measurement of signal amplitude. The aforesaid patent also describes the gain relationship of the arrangement depicted in FIG. 4a, albeit in terms of a single electrode system. The gain relationship in the present case is the same. The utility of a signal cancellation means 405 is described in the inventor's U.S. Pat. No. 4,879,461 as well as the U.S. Pat. No. 5,730,165 patent. The disclosure of U.S. Pat. No. 4,879,461 is herein incorporated by reference. The purpose of signal cancellation is to reduce the voltage (i.e. charge) buildup on the charge integrator 402 concurrently with the generation of each burst, so as to permit a higher coupling between the driven 100 and receiving 104 electrodes. One benefit of this approach is to allow a large sensing area that is sensitive to small deviations in coupling between 100 and 104 at a low cost. Such large sense couplings are present in physically large, highly interdigitated electrodes used in human touch sensing pads. Charge cancellation permits measurement of the amount of coupling with greater linearity, because linearity is dependent on the ability of the coupled charge from the driven 100 to the receiving 104 electrode to be sunk into a 'virtual ground' node over the course of a burst. If the voltage on the charge integrator 402 were allowed to rise appreciably during the course of a burst, the voltage would rise in inverse exponential fashion. This exponential component has a deleterious effect on linearity and hence on available dynamic range. There are numerous possible circuits disclosed in the inventor's previous capacitance sensing patents and patent applications that can accomplish charge cancellation, and all are applicable to the invention with at most minor variation.

It may be noted that if the charge measurement circuit had a high impedance, the currents induced by dV/dt would become manifest as actual voltage pulses on the receive electrode 104. Hence, the sensor would be susceptible to 'walk-by' interference from other objects that came near the output lead 112 to the charge detector. An object placed near the wiring of 112 will absorb some of the signal from the wire and cause a reduction in signal; this can look to the circuit exactly like a detection event, even when the object is not near the electrode set. More importantly, the use of a high impedance circuit connected to the receive electrode 104 will ensure that the length of wiring becomes a factor in determining the gain of the circuit, which is not good. Wiring will cause some of the signal to "bleed off" capacitively into free space, adjacent wires, and ground, forming a capacitance divider circuit together with coupling capacitance 105. The prior art shows numerous attempts to devise strategies for eliminating or reducing the effect of parasitic capacitance on electrode coupling. The present invention, which uses a detector having a low impedance or 'virtual ground', solves these problems by reducing voltage swings on the receive electrode 104 to inconsequential levels. A charge-transfer ("QT") detector of the type shown in FIG. 4a is easily the simplest and least expensive method of implementing a low impedance detector.

The low impedance nature of the receiver circuit depicted in FIG. 4a derives not from the charge cancellation circuit 405, but rather from the fact that the charge integrator 402 absorbs charge during the slew portion of the signal on the driven electrode 100 without rising appreciably in voltage. The charge cancellation circuit 405 exists to reduce the voltage rise on 402 during a burst, in order to improve both linearity and signal acquisition range, as described above.

The timing diagram shown in FIG. 4b shows how the rising edges 109 of the signal on 100 are 'captured' using a signal controlling switch 401. The switch 401 connects to position 1 of the controlling switch 401 before, during, and after the rising portion of drive signal 100. It is during the rising portion of 100, slew 109, that the charge is transferred across the coupling capacitance 105. However, if water or other conductive films are present on the touch surface, some of the coupled energy will lag in phase with respect to the edges 109. This is due to the distributed RC nature of such films. That is, the film receives an induced charge from the drive electrode 100 and the resulting induced currents flow through the resistive fluid sheet in two dimensions, and charge the parasitic capacitances associated therewith. If the sampling switch 401 is held in position 1 for a relatively long time after the rising slew 109 on the drive electrode 100 has ended, the film will couple back to the receive electrode 104 and thence through the sampling switch 401 any changes in charge due to the current distribution in the sheet. The conductive sheet will therefore increase the sampled signal the longer 401 is held in position 1 after the rising slew of 100 is complete. This effect is also described in my U.S. Pat. No. 5,730,165 with regard to water films around a water spout. It is better, in the presence of fluids, to disconnect switch 401 very quickly from position 1 so as to limit the recovery of charge from the distributed capacitance of the fluid film. For example, it has been noted experimentally that if the lag time between the cessation of the positive slew of 100 and the opening of 401 is less than 200 ns, moisture films will be strongly suppressed; at 50 ns lag time the suppression effect is almost complete.

It may be noted that Caldwell et al, in U.S. Pat. No. 5,572,205 also describe such effects in the frequency domain. Clearly, the root cause of the effect is the same in either the time or frequency domain. There is a strong advantage in making the switch closure time of the controlling switch 401 to position 1 narrow to suppress such conductive sheet effects (such as from water films), just as Caldwell et al. describe using high frequencies to ensure enhanced suppression of same. The present invention herein is believed superior to that described by Caldwell et al., inasmuch as it preferably operates in a burst mode and does not require any particular frequency of operation. Specifically, the present invention does not require a high frequency of operation that can lead to a high level of RF emissions. Apparatus of the present invention can operate at a low fundamental frequency or discontinuously (in bursts), yet still operate to achieve the identical purpose of the prior art, that is, to suppress the shunting effect of water films on the control surface, via the mechanism of temporal gate control.

Figure 5A:
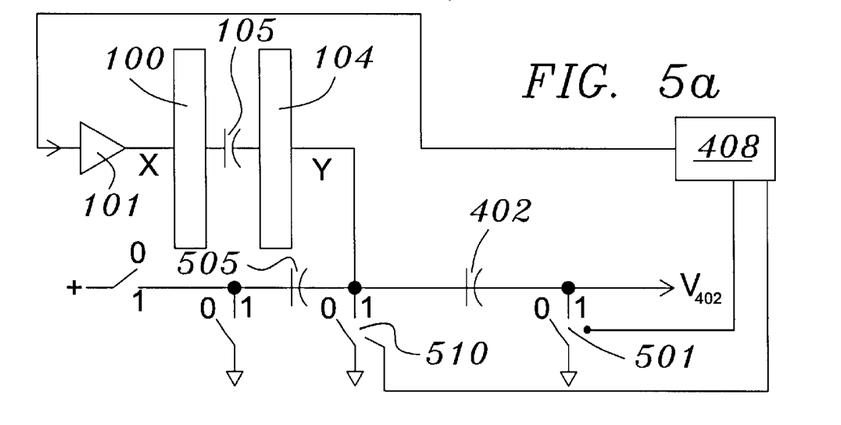
FIG. 5a is an electrical schematic of a second embodiment of a charge transfer measurement circuit.
Figure 5B:
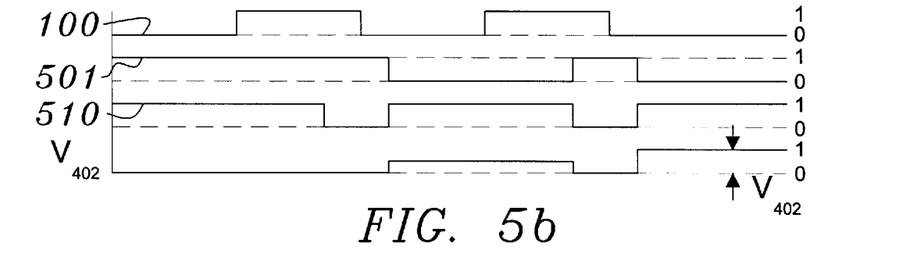

An approach to using supply-referenced switches in the apparatus of the present invention is schematically depicted in FIG. 5a. Here, the sampling switch 401 of FIG. 4a is replaced by a ground-referenced switch 501. The charge integrator, depicted as a simple capacitor 402, is still present and is directly electrically connected to the receiving plate. Charge cancellation can be implemented by switching in and out an optional capacitor 505, which serves a similar function as does the Cz capacitor of circuit 405 in FIG. 4a. In the depicted embodiment there are two switching elements 501, 510 respectively connected to each of the two terminals of the charge integrator, each of the switching elements 501, 510 adapted to selectively connect the respective terminal of the charge integrator to a reference potential or to disconnect it therefrom. The associated timing diagram of FIG. 5b shows the closure of the switches 501 and 510, and the drive signal 100 from the logic gate 101. As in FIG. 4b, the switch closures are timed to 'bracket' an edge of 101 (in this case the negative-going edge). Preferably, the bracketing is done narrowly around the edge of 101 for the reasons specified in conjunction with FIG. 4b. At the end of each burst of drive signal, the switch 501 is left open and the switch 510 is closed. As negative edges of 101 were sampled, the act of closing 510 will cause a positive voltage to appear across the open switch 501 (i.e., as indicated by V402 in FIG. 5b. This voltage can be detected by conventional means, such as amplification and conversion to digital form followed by numeric processing or by simple analog threshold comparison. It may be noted that the arrangement depicted in FIG. 5a is operated without switch crossover conduction between switches 501 and 510. If both of these switches were closed at the same time the sampling capacitor 402 would be inadvertently discharged during the normal course of a burst.

The voltage V402 at the end of the burst is the same as the voltage appearing at charge integrator 402 of FIG. 4a. Both voltages are affected by the same things: coupling across the electrodes, changes in dielectric properties, adjacency to other objects or substances, variation of drive voltage, etc.. Greater capacitive coupling will cause an increase in V402 at the end of each burst.

It should be noted that if conventional logic means, such as CMOS switches, are used to implement switches 501 and 510, the voltage appearing across 510 can become negative enough so as to cause conduction of protective clamp diodes intrinsic to conventional CMOS switches. It is important that this not be allowed to occur, as this will destroy sampled charge and introduce a large thermally dependent coefficient into the resultant signal. Although the problem can be avoided by designing a custom CMOS circuit that does not have clamping diodes, the problem can also be avoided by keeping the voltage on 501 within a few tenths of a volt of zero (for example, under 0.3 volts). This can be accomplished by any one or any combination of the following design choices:

1. Keeping 402 large, if a simple capacitor is used as 402
2. Using cancellation capacitance 505 as required during the course of a burst
3. Keeping the burst length 'n' short enough to limit the voltage
4. Reducing the capacitive coupling between elements 100 and 104.

As the resulting voltage in the presence of clamp diodes needs to be low (roughly at or under 0.3 volts) amplification to permit further processing may be required. In the alternative, a simple voltage comparator having a fixed threshold can be used to sense V402 and the burst length can be made variable, that is, made long enough so that a detection is 'just' sensed by the comparator. As the coupling capacitance 105 changes, the burst length could be altered accordingly. The length 'n' of the burst would then become the signal output. The greater the coupling of 105 is, the fewer cycles of 'n' required to reach the limit voltage sensed by the comparator.

The circuits described above lend themselves extremely well to multiplexing in an XY matrix. As is well known, matrix sensing is highly desirable because it reduces the number of interconnections required to the sensing areas. For example, if sixty-four sense areas are required to compose a keypad, then either a separate capacitance sensor can be used for each of the sixty-four sense areas, which would require sixty-four wires and a 64:1 analog multiplexer; or, an XY array of drive lines and receive lines can be implemented, which would result in only sixteen interconnections and a vastly smaller 8:1 analog multiplexer on the receive side. Furthermore, in the former case the sense leads to the individual sense pads remain sensitive and provide additional capacitive loading which is not necessarily the same from sense pad to sense pad. In the latter case, the sense lines themselves are not sensitive at all; only the sense elements formed by the electrodes drive 100 and receive 104 form a sensitive area, and there is little or no sensitivity in the connective wiring; accordingly the connective wiring can be of far greater length than in the former case. This ability to selectively dictate the sensing areas is a considerable advantage. Moreover, the non-multiplexed design does not provide for moisture film suppression as described hereinbefore. The only disadvantage of the XY multiplex approach is that it requires a more complex sense electrode structure composed of two adjacent and usually interleaved electrodes instead of one.

Figure 6:
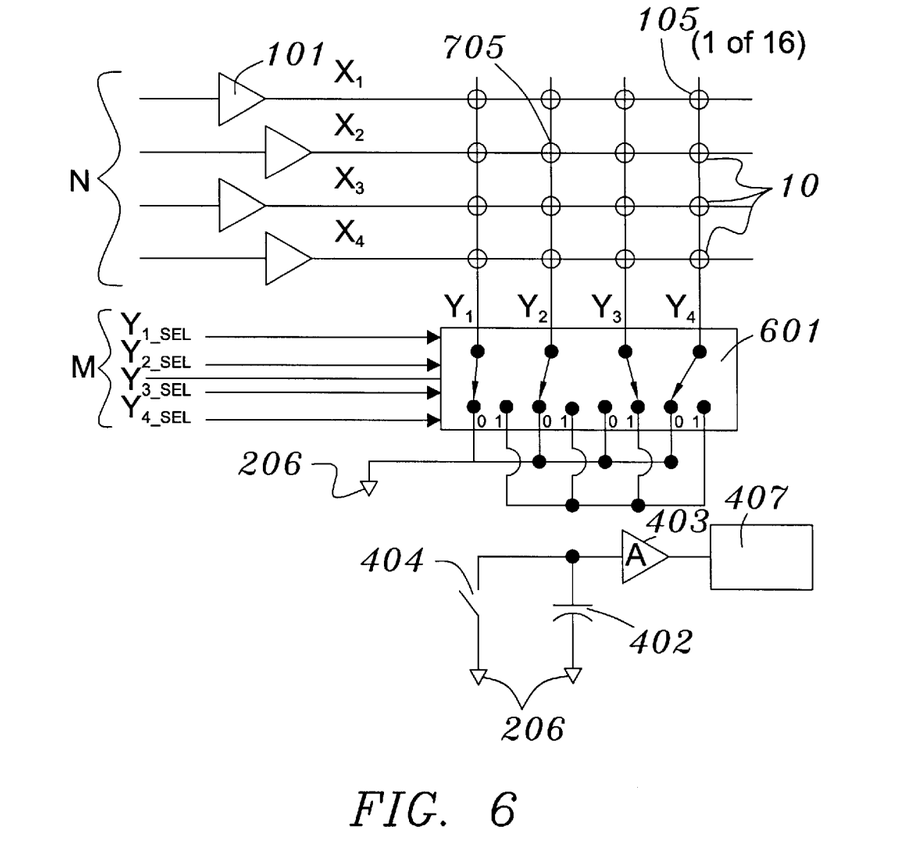

FIG. 6 shows an implementation of an N by M multiplexed array in accordance with the basic circuit approach depicted in FIG. 4a. The function of the sample switch 401 of FIG. 4a is provided by an analog multiplexer 601 that selects the respective switch paths in a timing sequence that replicates the actions earlier depicted in FIG. 4b. Multiplexer 601 includes grounding terminals to connect unsampled Y lines to ground, and thus is actually a set of 4 SPDT switches with one set of contacts connected to charge integrator 402. The grounded contacts are provided to neutralize opposing charge from the unsampled edges, as disclosed in conjunction with FIG. 4a.. In the absence of grounding action incorporated into the multiplexer, some other mechanism would be required to neutralize opposing edge charge on Y lines, such as a number of bleed-off resistors, one per Y line. The function of 601 can be conveniently implemented using a single monolithic IC or two quad switch packages such as the standard 74HC4066 CMOS IC with four inverters such as found in type 74HC04 IC driving the control lines of four of the switches in opposition to the other four switches. The switching elements contained in the analog multiplexer 601 perform the sampling function in addition to functioning as column selectors. The keys are the circled intersections of the N driven (X1, X2, X3, X4 ) lines and the M receiving (Y1 . . . Y4) lines. At each intersection where a key is desired, an electrode pair is provided. These pairs are essentially similar to the depiction of FIGS. 1a and 1b. In the interest of clarity of presentation, only a 4×4 matrix is shown in FIG. 6, but those skilled in the art will recognize there is no inherent limitation on the number of drive and receive lines. It is also possible to make a matrix that is not 'square', inasmuch as it has a different number of receive lines than drive lines. For example, a 6×3 array (6 drive and 3 receive lines) would yield 18 switch points. While non-square arrays are less resource-efficient than square ones, in many cases there is no need for the fill number of switch points that a square matrix would yield. For example if only 20 switches are needed, then a 5×4 or 4×5 matrix would suffice. It should be noted that the multiplexer 601 also includes switching action from the Y lines to ground when the Y lines are not conducting charge to be accumulated in charge integrator 402, so as to neutralize the opposing charge from the unsampled edges, as disclosed in conjunction with FIG. 4a.

Figure 7:
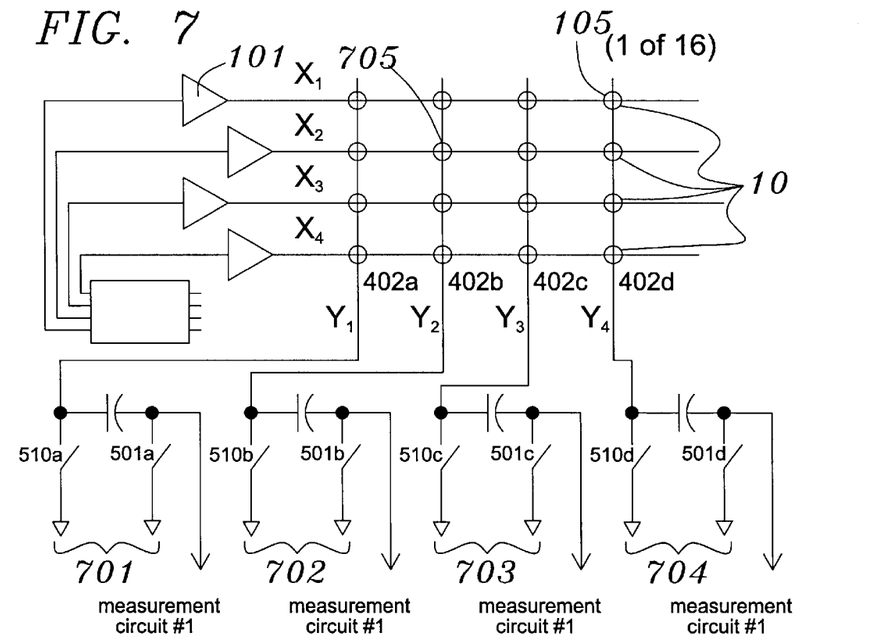

Turning now to FIG. 7, one finds a depiction of a multiplexing approach having functionality similar to that of the circuit of FIG. 6, but that employs the non-floating switching elements described hereinbefore with reference to the circuit depicted in FIG. 5a. As depicted in FIG. 7, no analog multiplexer for the receive lines is required. The multiplexing occurs by enabling only one of the switching pairs 701 through 704 on the receive side, and grounding or holding constant the unused switch pairs. For example, if it is desired to sense at key 705, drive line 706 alone (also labeled X2) carries drive burst signal, and the other X lines are held constant in either state. Correspondingly, only receive switch pair 702 is enabled to receive the coupled signal through the key 705, while the other receiving Y switch pairs are held in a constant state. When the drive signal burst on 706 is complete, the voltage on the charge integrating capacitor 402b across switch pair 702 is measured to determine the state of key 705 (i.e. the presence or absence of a finger, bulk fluid, or other object).

Alternately, the measurement circuits connected to switch pairs 701 through 704 may consist only of a voltage comparator with a fixed reference level. In this arrangement the signal at each key is ascertained by the number of cycles in each burst that are required to generate a predefined voltage across each of the charge integrating capacitors 402a–402d. The cycle count required is the reading of the signal level. This method is extremely simple to implement in hardware and software as described in association with FIGS. 5a and 5b above.

A key matrix may be scanned key-by-key in one of the above manners using combinations of drive bursts on each drive line, while enabling associated receive switch pairs in turn and creating a signal result for each key via a measurement process. The particular sequence of key scanning is not important, and keys can even be selected in a pseudo-random sequence if desired.

The circuit of FIG. 7 has an important advantage over that of FIG. 6. Instead of scanning key by key, as required for the circuit of FIG. 6, the FIG. 7 circuit can be scanned a whole row at a time, i.e. the keys in an entire X row can be sensed in parallel. The ability to do this results in a tremendous improvement in scan throughput and can free up enough acquisition time to allow the use of the controller 408 for other functions, thereby lowering overall system cost. To make FIG. 7 scan a complete row in one burst cycle, a row drive line (e.g. line 706) is made to toggle in a burst as described hereinbefore. During each falling drive signal within each such burst all the switch pairs 701 through 704 are enabled and toggled appropriately at the same time. Thus, each falling edge of 706 (said edge creating a dV/dt coupling across each key matrix electrode element pair within 706's row) creates a signal in each key element in its row. These signals are detected by the respective column lines, the signals being sampled by switch pairs 701 through 704 and the associated capacitors.

It is possible, but slightly less desirable to use the dV/dt created by the rising edges of the drive signals rather than the negative edges. If rising edges are used, the detection switches must be reconfigured slightly to accommodate the change, i.e., so that during the measurement interval the measurement circuit is connected to the Y column line. The Y line, being exposed to ambient conditions, may have electrical noise on it which can interfere with the measurement process. It is slightly better to use the negative edge and so permit the measurement circuit to remain isolated from the Y line by virtue of switches 510 being grounded during the measurement cycle It is also possible, with a slight circuit modification, to use both of the slews of the signals on the drive lines to double the effective acquisition speed. In the implementations described above only a single edge was employed to generate the requisite dV/dt across the electrode pairs. If both the rising and falling edges are employed, only half the number of cycles will be required per burst to acquire to the same level of system gain. This can be used to advantage, and may permit the use of a slower and cheaper microprocessor or other system controller 408, or may permit the controller to take on further functionality during the additional processing time made available by the faster scanning.

Figure 8A:
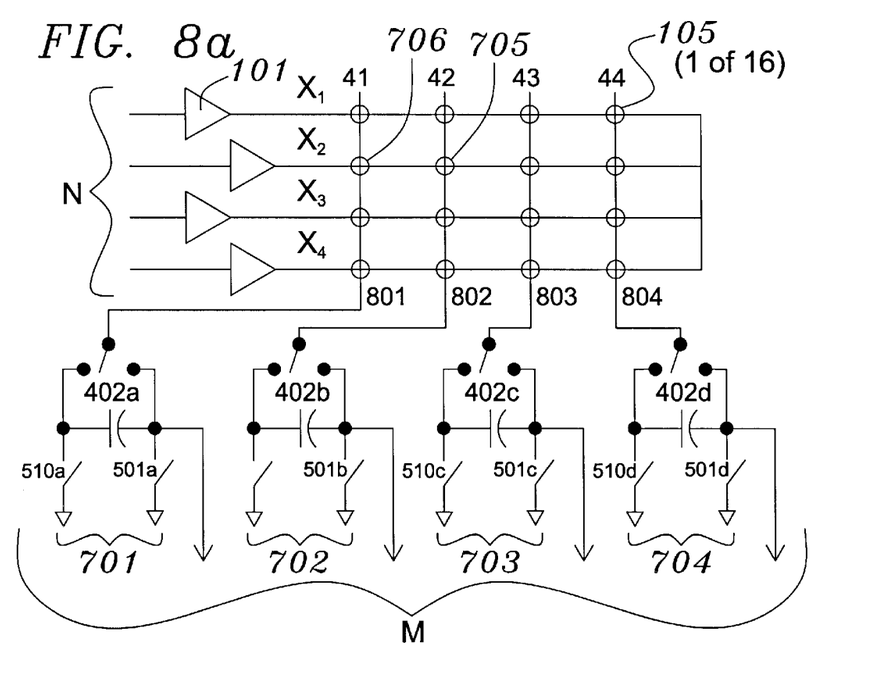
FIG. 8a is an electrical schematic of circuitry adapted to use both the leading and falling edges of the drive signal.
Figure 8B:
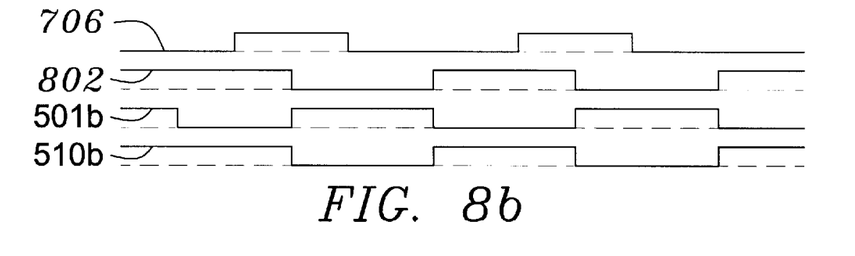

FIG. 8a shows one possible arrangement for using both rising and falling slews of the drive signals on drive electrodes 100 to double throughput. Additional switches 801 through 804 are added on the receive (column or Y) side to direct the edges to one side or another of the sample capacitors and sampling switch pairs. The switches are flipped at an appropriate stage between the rising and falling edges; and are controlled by a signal that is in quadrature (90 degrees out of phase) with the drive signal as shown in the timing diagram in FIG. 8b.

It may be noted that hybrid systems incorporating a mix of the multiplexed circuit types of FIG. 6 and FIG. 7 are also possible and may be desirable in some cases.

Those skilled in the art will also recognize that all the drive and control signals can be synthesized in software or firmware or may be directly generated in hardware using well-known design methodologies. Hence there are many approaches to ensuring that the switching elements operate in synchrony with the voltage source other than using the controller 408 that is depicted in the drawing.

It will further be recognized that one may use charge cancellation circuitry similar to that described in association with the apparatus depicted in FIGS. 4a and 5a in any of the multiplexed embodiments described in association with FIGS. 6, 7, 8a and 8b in order to increase the range of usable coupling capacitances.

There are many types of signal processing methods and algorithms that can be used to facilitate robust detection. For example, the amount of signal detected for each key can be 'drift compensated' by means of a relatively slow adjustment to either the detection threshold level and/or to the reference level. In a discrete analog circuit this can take the form of a slow integrator which provides the necessary correction, tracking the current deviation of the signal from the reference level by slowly adjusting the reference itself (or the threshold level, in a similar manner).

As another example, if the signal deviation is large enough to create a detection (i.e. a threshold level is crossed) and the detection persists for a long time the unit can be forced to recalibrate the reference level for the particular key that appears to be 'stuck'. The time that passes before a key is declared 'stuck' is, of course an informed choice on the part of the design engineer, and is commonly in the range of from five to thirty seconds.

Hysteresis thresholding should normally be applied to the comparison of the signal level to prevent contact bounce and persistent dithering caused by poor calibration and/or deviant signals.

'Detection integration', that is, the use of a counter to totalize an interval over which a threshold is exceeded, thus acting to filter out transient detection, is a useful tool in preventing detection caused by rapid events that are judged too quick to be 'real'. For example, a very rapid finger touch to a key panel could cause a detection, but that detection could be suppressed in some cases (for example, for safety reasons) in view of its short duration. Such integration can be accomplished by integrating time, by integrating burst interval counts, or other similar means.

Similar in nature to detection integration is the use of majority vote filtering. This filter uses the output of the threshold comparator, that is the logic 0 or logic 1 result, over a sampled period of time to create a final result. For example, it may be desirable to only create a valid final detection result when the sensor has detected a signal via thresholding in the last 4 out of 7 samples A form of low pass signal filtering that occurs ahead of the threshold comparator is a median filter. This filter takes an odd number of signal samples and finds the arithmetic median, or center value, of the set of samples. This filter type is unusually good at eliminating spike noise from the signal path. Other more conventional types of signal filtering such as simple low-pass filtering are useful and may be required for a design.

Figure 9:
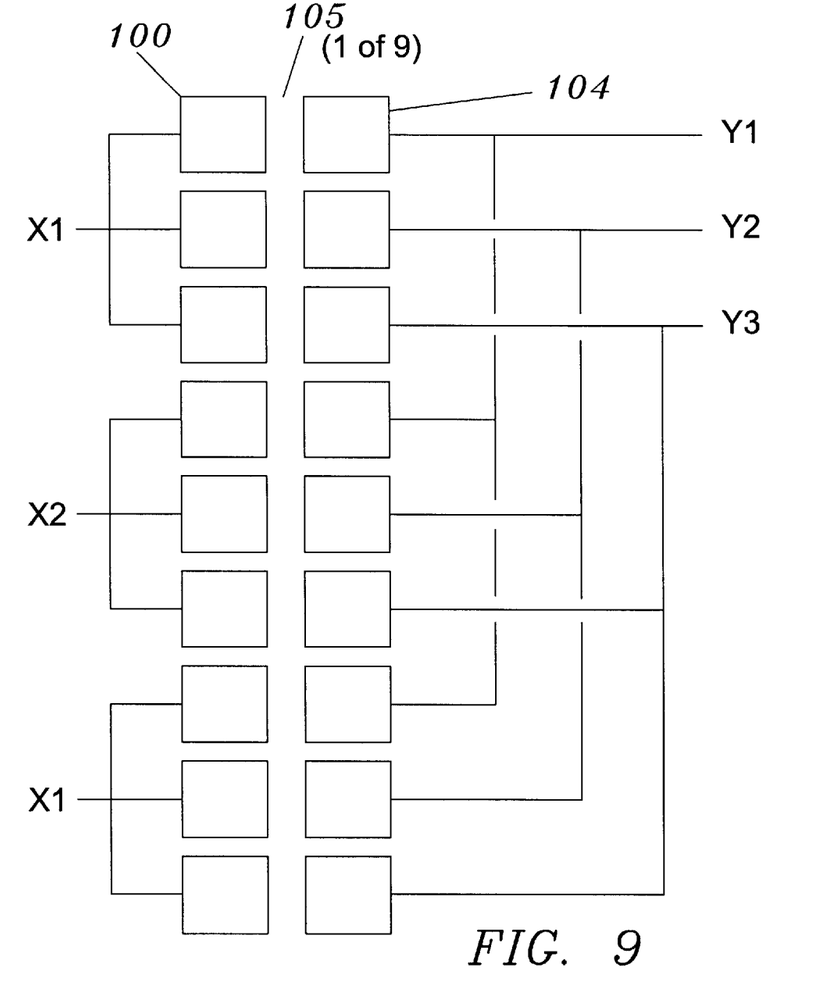
FIG. 9 is a schematic depiction of a slider control or fluid level sensing probe made according to the invention.

As with many keypads there are control functions which are desirable for safety or human factors reasons. These methods are well known in the art but are worth mentioning again here. One is the use of control interlocking, whereby a function cannot be selected unless at least two keys are pressed, either sequentially or at once. Interlocking can prevent inadvertent activation, for example for safety reasons. The methods disclosed herein are suitable for control interlocking, since the key matrix is fully capable of n-key rollover (it detects all keys independently and, from a functional standpoint, simultaneously). Another function possible is the use of an array of electrode pairs arranged in a linear 'slider' control, for example to allow the keypad, or a subsection thereof, to act as an intensity, volume, or fader control (or other function) as normally would be implemented with a potentiometer or encoder (FIG. 9). The geometric shape of the slider is not important and the invention is not restrictive in this regard. The slider can be linear, curved, or even 3-dimensional in shape.

Apparatus of the invention may be used for level sensing - e.g., for measuring the level of bulk powders or of fluids in a vessel. Instead of arranging the keys in a 2-dimensional matrix, the keys could be arranged in a linear array, as depicted in FIG. 9. By attaching the array to the outside of a non-shielding (Le. non-metallic) vessel of suitable thickness, the presence of a fluid inside the vessel can be sensed Because the keys can readily discriminate between surface films and bulk matter the presence of a film adhering to the inside of the vessel will not confound the sensor. If the vessel is shielding (made of metal or metal plated for example), the keys can be arrayed along a 'dip stick' which can be inserted into the vessel, or adhered to the inside of the vessel wall.

Although the invention has been described with the use of an overlying 'panel' material which 'mixes' the e-fields to provide coupling to the detection side, for example to detect human touch, the electrodes can also sense material directly without benefit of an intervening panel if the material is a dielectric such as oil or petrol. The electrodes depicted in FIG. 9 can sense fluid levels in this manner by direct electrode contact instead of through a panel, or at most, through a thin protective layer. In this case the coupling between electrode pairs increases in the presence of the dielectric fluid due to the creation of a path through which the e-fields can travel.

It is also possible to interpolate among the sense 'keys' to create a fluid level sensor or slider control having higher effective resolution than given by the keys themselves. This is accomplished by interpreting the analog signal from the key which is only in partial submersion or contact to create a fractional position. The calibration data for this interpolation is easily derived from the signal strength received from lower, submersed keys.

Also, the keys can be arranged so that they are at least partially overlapping to facilitate interpolation without gaps in the sensing region.

It may be noted that nothing prevents the designer from making some keys smaller than others, for example to increase resolution along some parts of the measurement range while relaxing resolution elsewhere. A useful arrangement is to space the keys logarithmically to provide smoothly increasing resolution as a tank empties. This may be useful, for example, in an automotive gasoline tank As mentioned hereinbefore, in the presence of a bulk amount of ionically conducting fluid (or a liquid metal, such as mercury) the strength of signal coupling across the electrode gap will actually decrease. On the other hand, with materials such as oils, gasoline, grains, or other dry or non-conducting materials, the coupling between the electrodes will increase, since they will provide more cross coupling between the electrodes than they will break flux lines away from the receiving electrodes. This difference is readily accommodated by circuit and/or software changes.

Another use of the sensor is as a 'dual use' device to detect both an ionic and non-ionic fluid. For example, a 'dip stick' can be constructed and software provided that will sense the presence of water in an oil tank, and read both levels at the same time. This feature can be combined with other features, such as logarithmic spacing of the keys.

A linear array made in accordance with the invention can be used to sense the position of an object, for example to implement a linear or rotary encoder. Capacitance has an advantage over electromechanical and optical technologies in that it requires very little power, has zero backlash, and cannot wear out since if made non-contacting. A device using an interpolated linear array might easily replace magnetic-based LVDI's for example. Capacitive encoders are known in the trade, and the applicability of the invention to encoders is not novel. If employed as a linear encoder, the electrodes can be arrayed as shown in FIG. 9. If rotary, the electrodes can be arrayed in a circular shape around an axis. In either case the encoder is affected by a vane or other component that affects the cross-coupling of the electrode pairs and which is interpreted electronically to correspond to a position.

Although the present invention has been described with respect to several preferred embodiments, many modifications and alterations can be made without departing from the invention. Accordingly, it is intended that all such modifications and alterations be considered as within the spirit and scope of the invention as defined in the attached claims.

What is claimed is:

1. A method of operating a key by sensing the presence of a body proximate a coupling capacitor and spaced apart therefrom by a dielectric layer, the coupling capacitor comprising a driven plate and a receiving plate, the driven plate electrically connected to a signal generator supplying a plurality of voltage cycles, the receiving plate connected to a reference potential whenever it is not connected to processing circuitry comprising a charge integrator having two terminals, the method comprising the steps of:
   a) controlling one or more of a plurality of switching elements so as to set both terminals of the charge integrator to the reference potential;
   b) controlling one or more of the plurality of switching elements during a predetermined portion of each of a predetermined number of the voltage cycles, to connect the receiving plate to the charge integrator, thereby transferring electric charge from the receiving plate to the charge integrator; and;
   c) measuring a voltage on one of the two terminals of the charge integrator.

2. The method of claim 1 wherein the second terminal of the charge integrator is connected directly to the reference potential, wherein the plurality of switching elements comprises a first switching element and a second switching element different from the first switching element and wherein in step a) the first switching element connects the first terminal of the charge integrator to the reference potential and the second switching element disconnects the receiving plate from the charge integrator; and in step b) the first switching element does not connect the first terminal of the charge integrator to the reference potential and the second switching element connects the receiving plate to the first terminal of the charge integrator.

3. The method of claim 1 wherein the receiving plate is directly electrically connected to the second terminal of the charge integrator, wherein the plurality of switching elements comprise a first switching element connected to the second terminal of the charge integrator and a second switching element connected to the first terminal of the charge integrator and wherein in step a) the first and the second switching elements both connect the respective terminal to the reference potential.

4. Apparatus for sensing the presence of a body proximate a coupling capacitor and separated therefrom by a dielectric, the coupling capacitor comprising a driven plate and a receiving plate adapted to be connected to a reference potential whenever it is not connected to a processing circuit, the apparatus comprising:

a voltage source connected to the driven plate, the voltage source adapted to supply a periodic plurality of voltage cycles, each of the cycles having a predetermined duration, to the driven plate;

a plurality of switching elements;

the processing circuit comprising a charge integrator having two terminals, the charge integrator adapted to be connected to the receiving plate, the charge integrator directly connected to at least a first of the plurality of switching elements;

the processing circuit further comprising a voltage measurement circuit adapted to measure a voltage on the charge integrator, the measured voltage indicative of the change of electrical capacitance between the driven plate and the receiving plate; wherein the controller is adapted to initiate a measurement by controlling a first predetermined one or more of the switching elements, the first predetermined one or more of the switching elements comprising at least the first switching element, so as to connect both terminals of the charge integrator to the reference potential; and wherein the controller is further adapted to transfer electric charge from the receiving plate to the sampling capacitor by controlling a second one or more of the switching elements in synchrony with the voltage source.

5. The apparatus of claim 4 wherein a first of the two terminals of the charge integrator is directly connected to the reference potential and the first predetermined one of the plurality of switching elements is connected between the second terminal of the charge integrator and the reference potential; and the second one of the plurality of switching elements is electrically connected between the receiving plate and the second terminal of the charge integrator.

6. The apparatus of claim 4 wherein:

the receiving plate is directly electrically connected to the first terminal of the charge integrator, the first of the switching elements is connected between the first terminal of the charge integrator and the reference potential;

the second of the two switching elements is connected between the second terminal of the charge integrator and the reference potential; and wherein the controller is adapted to initiate a measurement by closing the first and the second of the switching elements so as to connect both terminals of the charge integrator to the reference potential.

7. A key matrix comprising a first plurality, N, of input lines, a second plurality, M, of output lines and N times M keys, wherein each key comprises a respective capacitive sensor adapted to sense the presence of an object proximate thereto and wherein each key is disposed adjacent a respective intersection of an input line and an output line, the key matrix characterized in that:

each of the keys comprises a respective driven plate connected to one of the N input lines and a respective receiving plate connected to one of the M output lines;

each of the input lines is electrically connected to a respective signal generator, each signal generator adapted to supply a respective periodic plurality of voltage cycles to each of the driven plates connected thereto;

the key matrix further comprising:

a controller adapted to control each of a plurality of switching elements; the controller adapted to control a first predetermined number of the plurality of switching elements so as to connect each of the receiving plates to a reference potential when that receiving plate is not connected to one of the two terminals of a charge integrator;

the charge integrator adapted to be connected to at least one of the receiving plates during a predetermined portion of the respective voltage cycle supplied to the driven plate associated with the at least one of the receiving plates, the charge integrator directly connected to at least a first of the plurality of switching elements; and a measurement circuit adapted to measure a voltage on the charge integrator as an indication of the proximate presence of the object.

8. The key matrix of claim 7 wherein:

the first predetermined number of switching elements comprises a multiplexer;

the second of the two terminals of the charge integrator is directly electrically connected to the reference potential; and the first of the predetermined number of switching elements comprises a switching element adapted to connect the first terminal of the charge integrator to the reference potential.

9. The key matrix of claim 7 wherein:

each of the M output lines is directly electrically connected to a respective first terminal of a respective charge integrator;

each of a first M respective ones of the switching elements is connected between the respective first terminal of the respective charge integrator and the reference potential; and each of a second M respective ones, separate from the first M respective ones, of the switching elements is connected between the second terminal of the respective charge integrator and the reference potential.

10. The key matrix of claim 7 wherein:

each of the M output lines is electrically connected to a respective one of a first set of M switching elements, each of the first set of M switching elements connecting the respective output line to either a first terminal of a respective charge integrator or to the second terminal of the respective charge integrator;

each of a second set of M switching elements, the second set separate from the first set, is connected between the respective first terminal of the respective charge integrator and the reference potential; and each of a third set of M switching elements, the third set separate from both the first and the second sets, is connected between the second terminal of the respective charge integrator and the reference potential.

* * * * *